(12) United States Patent
Liu et al.

(10) Patent No.: US 12,402,273 B2
(45) Date of Patent: Aug. 26, 2025

(54) LIQUID COOLED ELECTRONIC DEVICE

(71) Applicant: SHENZHEN MICROBT ELECTRONICS TECHNOLOGY CO., LTD., Guangdong (CN)

(72) Inventors: Fangyu Liu, Guangdong (CN); Yuefeng Wu, Guangdong (CN); Yang Gao, Guangdong (CN); Qian Chen, Guangdong (CN); Hongyan Ning, Guangdong (CN)

(*) Notice: Subject to any disclaimer, the term of this patent is extended or adjusted under 35 U.S.C. 154(b) by 179 days.

(21) Appl. No.: 18/287,333

(22) PCT Filed: May 16, 2022

(86) PCT No.: PCT/CN2022/092991
§ 371 (c)(1),
(2) Date: Oct. 18, 2023

(87) PCT Pub. No.: WO2022/242587
PCT Pub. Date: Nov. 24, 2022

(65) Prior Publication Data
US 2024/0196561 A1    Jun. 13, 2024

(30) Foreign Application Priority Data

May 18, 2021 (CN) .......................... 202121069364.7

(51) Int. Cl.
*H05K 7/20* (2006.01)
(52) U.S. Cl.
CPC ..... *H05K 7/20236* (2013.01); *H05K 7/20781* (2013.01); *H05K 7/20927* (2013.01)
(58) Field of Classification Search
CPC ............ H05K 7/1492; H05K 7/20236; H05K 7/20781; H05K 7/20927
See application file for complete search history.

(56) References Cited

U.S. PATENT DOCUMENTS 10,809,775 B2 * 10/2020 Saito .......................... G06F 1/20
12,004,321 B2 *  6/2024 Moon ................ H05K 7/20236
(Continued)

FOREIGN PATENT DOCUMENTS

| CN | 110989787 A | 4/2020 |
|---|---|---|
| CN | 111726970 A | 9/2020 |

(Continued)

OTHER PUBLICATIONS

International Search Report for PCT/CN2022/092991 dated Aug. 10, 2022 (7 pages including English Translation).

(Continued)

*Primary Examiner* — Robert J Hoffberg
(74) *Attorney, Agent, or Firm* — Merchant & Gould P.C.

(57) ABSTRACT

The present application discloses a liquid cooled electronic device. The liquid cooled electronic device comprises a chassis unit. The chassis unit is circumferentially closed relative to a first direction. A first accommodating space extending in the first direction is formed within the chassis unit. A liquid cooled computing unit and a liquid cooled power supply unit that are electrically connected are arranged in the first accommodating space. The liquid cooled computing unit and the liquid cooled power supply unit are respectively inserted into the first accommodating space through a first guide rail and a second guide rail. The first guide rail and the second guide rail are arranged in parallel in the first direction. That is, the liquid cooled computing unit and the liquid cooled power supply unit are arranged in parallel via the parallel arrangement of the first guide rail and the second guide rail.

9 Claims, 8 Drawing Sheets

(56) References Cited

U.S. PATENT DOCUMENTS

| | | | |
|---|---|---|---|
| 12,225,686 B2* | 2/2025 | Gao | H05K 7/20263 |
| 2015/0334880 A1 | 11/2015 | Best | |
| 2019/0317570 A1 | 10/2019 | Saito | |
| 2023/0209769 A1 | 6/2023 | Gao et al. | |
| 2024/0251524 A1* | 7/2024 | Liu | H05K 7/20272 |
| 2024/0389266 A1* | 11/2024 | Matsuo | H01L 23/44 |
| 2025/0081383 A1* | 3/2025 | Lau | H05K 7/1491 |

FOREIGN PATENT DOCUMENTS

| | | | |
|---|---|---|---|
| CN | 111857281 A | 10/2020 | |
| CN | 212851472 U | 3/2021 | |
| CN | 112714597 A | 4/2021 | |
| CN | 215956915 U | 3/2022 | |

OTHER PUBLICATIONS

Written Opinion for PCT/CN2022/092991 dated Aug. 10, 2022 (7 pages including English Translation).
First Office Action dated Dec. 9, 2024 for corresponding CA Application No. 3,214,392 (6 pages).

* cited by examiner

LIQUID COOLED ELECTRONIC DEVICE

CROSS-REFERENCE TO RELATED APPLICATIONS

This application is a National Stage Application of International Application No. PCT/CN2022/092991, filed 16 May 2022, which claims benefit of Serial No. 202121069364.7, filed 18 May 2021 in China, and which applications are incorporated herein by reference. To the extent appropriate, a claim of priority is made to each of the above disclosed applications.

TECHNICAL FIELD

The present application relates to a technical field of heat dissipation via liquid cooling, and in particular, to a liquid cooled electronic device.

BACKGROUND

With development of technology, computing density of an electronic device is gradually increasing, leading to increasing of per-unit heat that is generated by the electronic device. This imposes a high requirement for heat dissipation of the electronic device.

In some techniques, heat dissipation via liquid cooling has been gradually applied to the electronic device with a high power density. For example, a common method for heat dissipation via liquid cooling includes first removing a cooling fan on an electronic device that adopts heat dissipation through air cooling, and then immersing the electronic device in a cooling liquid of a liquid cooling apparatus. The liquid cooling apparatus is provided with a liquid inlet at a lower portion thereof and a liquid outlet at an upper portion thereof. The liquid inlet and the liquid outlet are in communication with a circulating pump and a cooling source apparatus to form a circulation loop. As such, the cooling liquid circulates in the circulation loop to absorb heat from the electronic device and then release the heat at the cooling source apparatus, thereby completing heat dissipation of the electronic device via liquid cooling.

SUMMARY

Embodiments of the present application provide a liquid cooled electronic device. The liquid cooled electronic device includes a chassis unit. A first accommodating space extending in a first direction is formed within the chassis unit. A liquid cooled computing unit and a liquid cooled power supply unit are arranged in the first accommodating space. The liquid cooled computing unit and the liquid cooled power supply unit are inserted into the first accommodating space through a first guide rail and a second guide rail respectively. The first guide rail and the second guide rail are arranged in parallel in the first direction. That is, the liquid cooled computing unit and the liquid cooled power supply unit may be arranged in parallel via the parallel arrangement of the first guide rail and the second guide rail. As such, when the liquid cooled electronic device needs to be repaired or maintained, only the liquid cooled computing unit or the liquid cooled power supply unit that needs to be repaired or maintained should be targeted and taken out, which is convenient to operate. Therefore, one does not need to take the entire liquid cooled electronic device out from the liquid cooling apparatus. A technical problem of inconvenient operation during the maintenance or repair caused by structural limitations of conventional electronic devices is solved. Technical effects of facilitating operations, such as repair or maintenance, and improving efficiency are achieved.

An embodiment of the present application provides a liquid cooled electronic device comprising:
- a chassis unit that is circumferentially closed relative to a first direction, with a first accommodating space extending in the first direction formed within the chassis unit;
- a liquid cooled computing unit that is arranged in the first accommodating space; and
- a liquid cooled power supply unit that is arranged in the first accommodating space and is electrically connected to the liquid cooled computing unit;
- wherein a first guide rail and a second guide rail are respectively arranged within the chassis unit at positions corresponding to the first accommodating space, the first guide rail is configured for insertion of the liquid cooled computing unit, and the second guide rail is configured for insertion of the liquid cooled power supply unit; and
- the first guide rail and the second guide rail extend in parallel in the first direction, so that the liquid cooled computing unit and the liquid cooled power supply unit are arranged parallelly.

In some embodiments, a second accommodating space is additionally formed within a second end of the chassis unit in the first direction, and an overflow through hole is provided on a side wall of the chassis unit at a position corresponding to the second accommodating space, so that a cooling liquid flows in from a first end of the chassis unit and flows out from the overflow through hole.

In some embodiments, a panel unit is mounted at the second end of the chassis unit, the panel unit comprises a chassis panel and a control panel, and the control panel is inserted into the chassis panel in the first direction, so that the control panel is located in the second accommodating space; and a height of the control panel relative to the chassis panel in the first direction is adjustable.

In some embodiments, an insertion groove extending toward the second accommodating space is provided on a side of the chassis panel; the control panel comprises a fixing plate configured to be embedded in the chassis panel, an insertion guide rail is arranged on a side of the fixing plate, and the insertion guide rail is slidably inserted into the insertion groove.

In some embodiments, a limiting structure is additionally arranged between the insertion groove and the insertion guide rail, and the limiting structure is configured for adjusting a length with which the insertion guide rail is slidably inserted into the insertion groove in the first direction; and wherein the limiting structure is movably mounted to the insertion guide rail, or the limiting structure is movably mounted to the insertion groove.

In some embodiments, an amount of the liquid cooled power supply unit is at least one (1), and an amount of the liquid cooled computing unit is at least two (2); and one liquid cooled power supply unit is connected to at least two liquid cooled computing units, wherein,
- the at least two liquid cooled computing units are located on a same side of the one liquid cooled power supply unit; or
- the at least two liquid cooled computing units are respectively arranged on two sides of the one liquid cooled power supply unit.

In some embodiments, the liquid cooled computing unit comprises a computing board, a heat dissipation plate is arranged on at least one side of the computing board, and a pair of mounting guide grooves are provided on two ends of the heat dissipation plate in the first direction; and wherein the first guide rail comprises a pair of mounting guide rails arranged opposite to each other, and the pair of mounting guide rails are configured to be slidably inserted into the pair of mounting guide grooves.

In some embodiments, the second guide rail comprises a pair of limiting guide grooves arranged opposite to each other, and the pair of limiting guide grooves are configured for slidable insertion of two side walls of the liquid cooled power supply unit.

In some embodiments, a base plate unit is mounted to the first end of the chassis unit, and a flow hole is provided on the base plate unit for the cooling liquid to flow through.

In some embodiments, the liquid cooled computing unit is electrically connected to the liquid cooled power supply unit via a copper bar;

two ends of the liquid cooled power supply unit respectively abut against the panel unit and the base plate unit in the first direction, the liquid cooled power supply unit has an external input socket, and the panel unit is provided with a power supply hole corresponding to the external input socket; and/or two ends of each liquid cooled computing unit respectively abut against a support boss and a limiting block in the first direction, the limiting block is fixed to a side of the panel unit, and the support boss is fixed to the first guide rail.

One or more technical solutions provided in the embodiments of the present application have at least the following technical effects or advantages.

An embodiment of the present application provides a liquid cooled electronic device. The liquid cooled electronic device includes a chassis unit. A first accommodating space extending in a first direction is formed within the chassis unit. Then a liquid cooled computing unit and a liquid cooled power supply unit are arranged in the first accommodating space. The liquid cooled computing unit and the liquid cooled power supply unit are inserted into the first accommodating space through a first guide rail and a second guide rail respectively. The first guide rail and the second guide rail are arranged in parallel in the first direction. That is, the liquid cooled computing unit and the liquid cooled power supply unit may be arranged in parallel through parallel arrangement of the two guide rails. As such, when the liquid cooled electronic device needs to be repaired or maintained, only the liquid cooled computing unit or the liquid cooled power supply unit that needs to be repaired or maintained needs to be targeted and taken out, which is convenient to operate. Therefore, one does not need to take the entire liquid cooled electronic device out from the liquid cooling apparatus. A technical problem of inconvenient operation during the maintenance or repair caused by structural limitations of conventional electronic devices is solved. Technical effects of facilitating operations, such as repair or maintenance, and improving efficiency are achieved.

BRIEF DESCRIPTION OF THE DRAWINGS

In order to describe clearly technical solutions of embodiments of the present application, accompanying drawings for describing the embodiments of the present application will be briefly described below. Apparently, the accompanying drawings in the following description illustrate only some of the embodiments of the present application. A person of ordinary skill in the art may derive other drawings from those accompanying drawings without paying inventive efforts.

Figure 1:
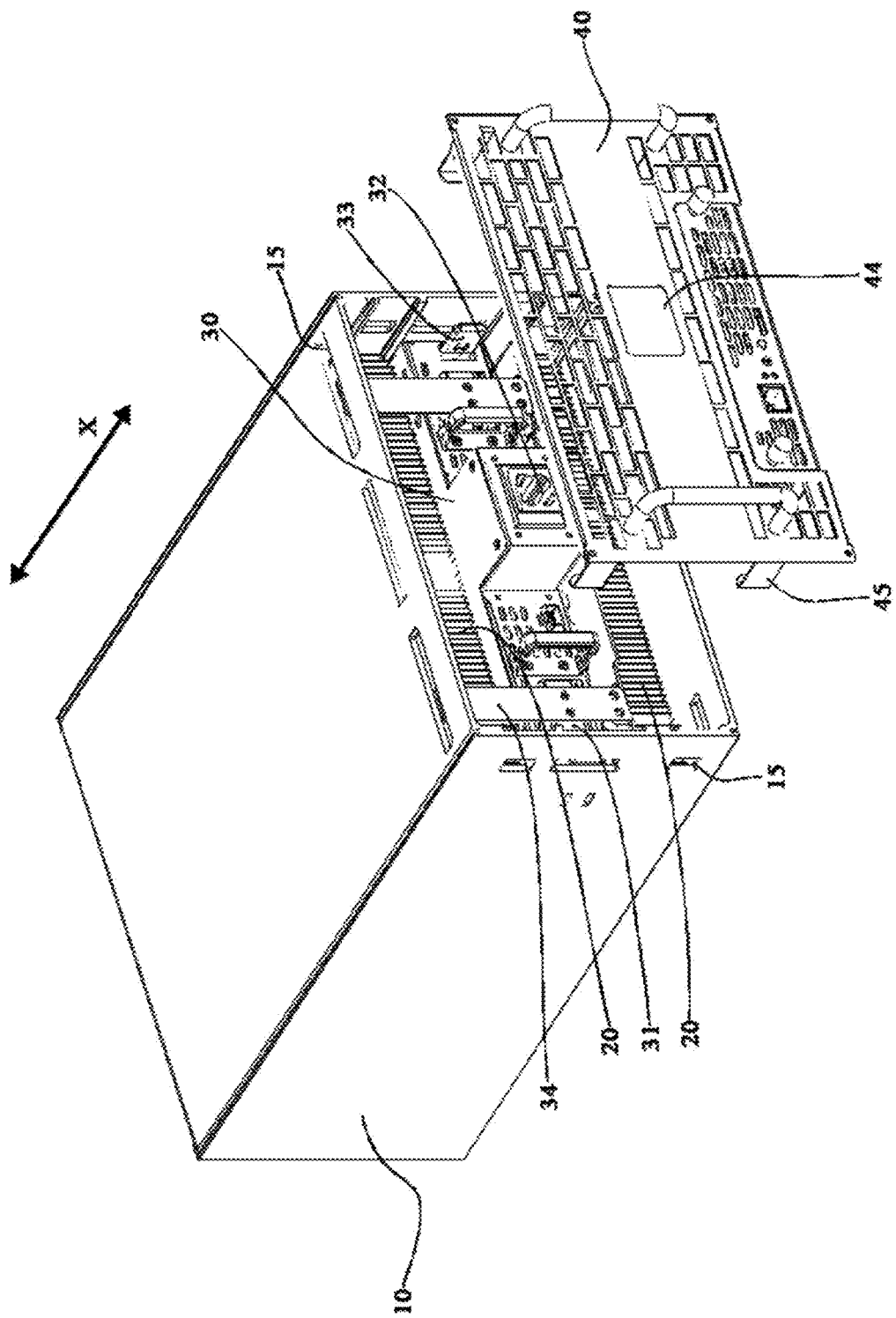
FIG. 1 is a schematic structural diagram of a liquid cooled electronic device according to some embodiments of the present application.

Reference numerals include:
100—liquid cooled electronic device, 200—liquid cooling apparatus, 201—cooling liquid inlet, 202—cooling liquid outlet,
10—chassis unit, 11—first accommodating space, 12—second accommodating space, 13—mounting guide rail, 14—limiting guide groove, 15—overflow through hole, 16—limiting hole, 17—support boss,
20—liquid cooled computing unit, 21—computing board, 22—heat dissipation plate, 23—mounting guide groove,
30—liquid cooled power supply unit, 31—power supply terminal, 32—external input socket, 33—limiting elastic piece, 34—copper bar,
40—panel unit, 41—chassis panel, 42—control panel, 43—limiting structure, 44—power supply hole, 45—limiting block,
411—guide plate,
421—fixing plate, 422—control board, 423—fixing screw, 424—insertion guide rail,
50—base plate unit, 51—flow hole, and
X—first direction.

DETAILED DESCRIPTION

For better understanding of the above technical solutions, exemplary embodiments of the present application are described in detail below with reference to accompanying drawings. Apparently, the described embodiments are merely some (rather than all) of the embodiments of the present application. It should be understood that the present application is not limited to the exemplary embodiments described herein.

In some techniques, a solution of heat dissipation via liquid cooling has been gradually applied to an electronic device with a high power density. However, it is found that in such a solution, the electronic device, after being assembled with a liquid cooling system, is completely immersed in a cooling liquid. In this arrangement, when a module (such as a power supply module, a computing module, and the like) within the electronic device needs to be maintained or repaired, the entire electronic device has to be taken out from the cooling liquid due to structural limitations, which causes great inconvenience to operations such as maintenance, repair, and the like. That is, for a method of heat dissipation via liquid cooling that utilizes cooling liquid circulation, it is desired to design a novel liquid cooled electronic device to facilitate operations such as repair, the maintenance, and the like.

Figure 3:
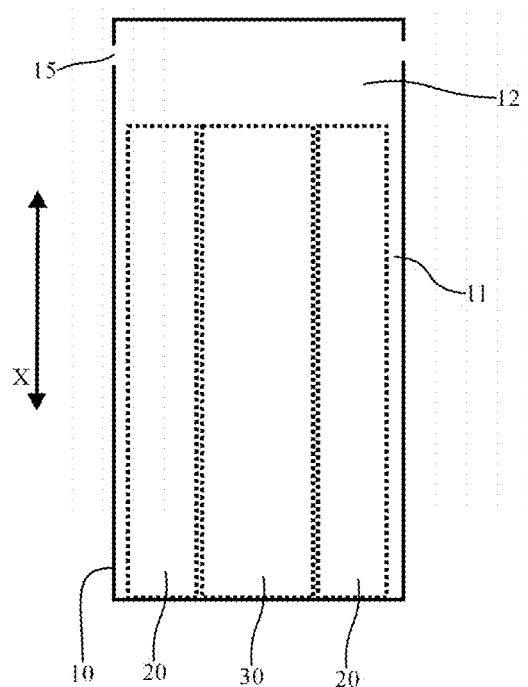
FIG. 3 is a schematic diagram of a relative position relationship between a first accommodating space and a second accommodating space according to some embodiments in of the present application.
Figure 4:
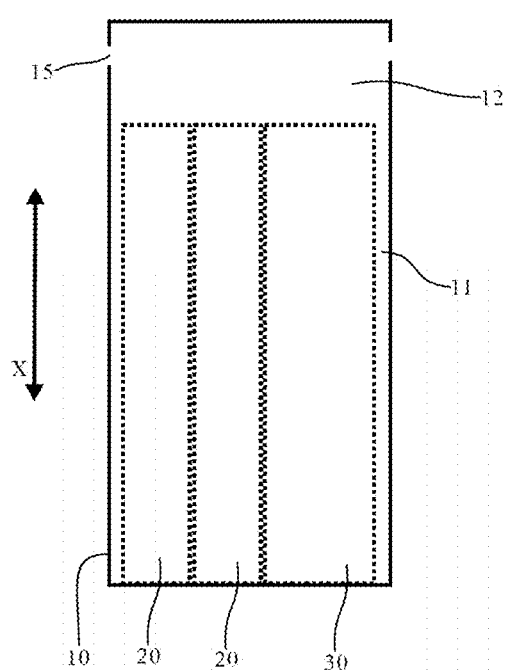
FIG. 4 is a schematic diagram of another relative position relationship between a liquid cooled computing unit and a liquid cooled power supply unit in FIG. 3.
Figure 8:
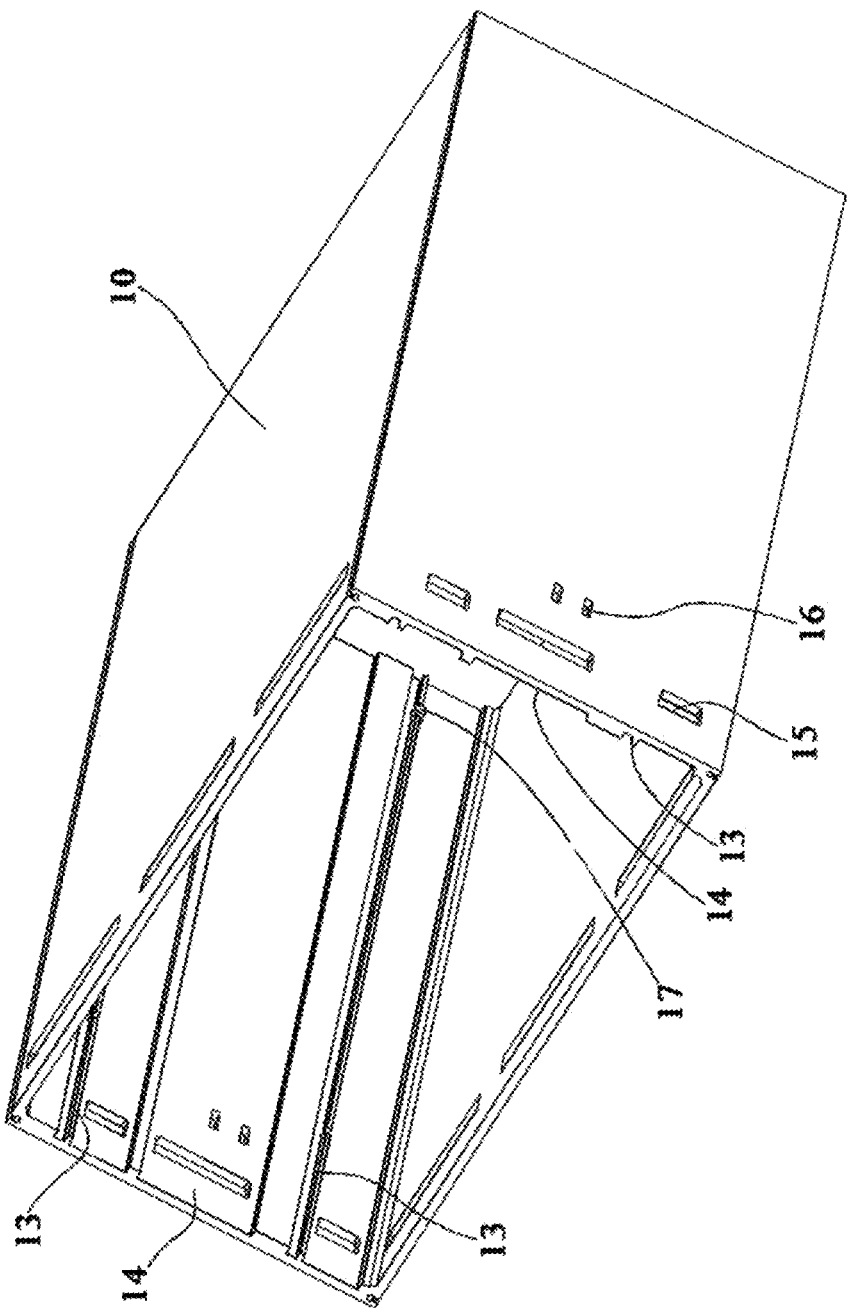
FIG. 8 is a schematic structural diagram of a mounting guide rail and a limiting guide groove according to some embodiments of the present application.

Reference is made to FIG. 1 first. FIG. 1 is a schematic structural diagram of a liquid cooled electronic device according to some embodiments of the present application. Some embodiments of the present application provide a liquid cooled electronic device 100. The liquid cooled electronic device 100 includes a chassis unit 10, a liquid cooled computing unit 20, and a liquid cooled power supply unit 30. The chassis unit 10 is circumferentially closed relative to a first direction (which is, for example, a direction as shown by "X" in FIG. 1). A first accommodating space 11 extending in the first direction is formed within the chassis unit 10 (as shown in FIG. 3 and FIG. 4). At least one liquid cooled computing unit 20 is arranged in the first accommodating space 11. At least one liquid cooled power supply unit 30 is arranged in the first accommodating space 11. The liquid cooled power supply unit 30 is electrically connected to the liquid cooled computing unit 20, for supplying power to the liquid cooled computing unit 20. A first guide rail and a second guide rail (for example, mounting guide rails 13 as shown in FIG. 8) are respectively arranged within the chassis unit 10 at positions corresponding to the first accommodating space 11. The first guide rail is configured for insertion of the liquid cooled computing unit 20, and the second guide rail is configured for insertion of the liquid cooled power supply unit 30. The first guide rail and the second guide rail extend in parallel in the first direction, so that the liquid cooled computing unit 20 and the liquid cooled power supply unit 30 are parallelly arranged.

Figure 2:
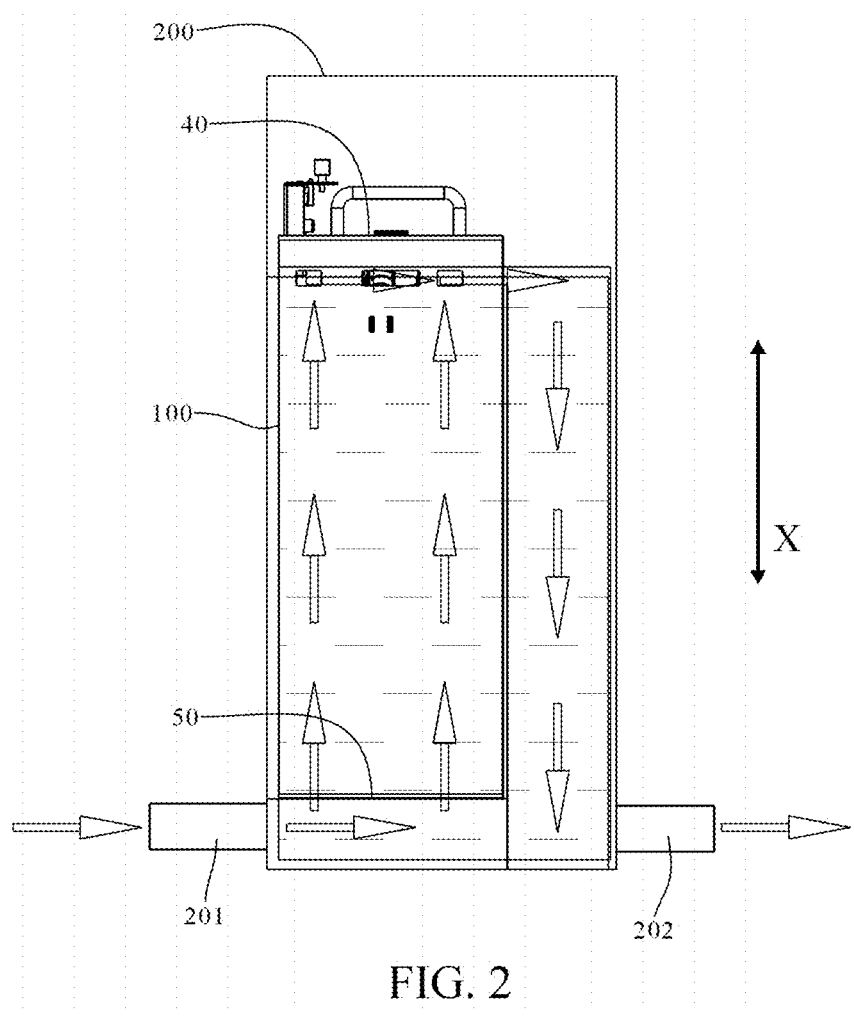
FIG. 2 is a schematic structural diagram of a liquid cooled electronic device being placed in a liquid cooling apparatus according to some embodiments of the present application.

FIG. 2 is a schematic structural diagram of a liquid cooled electronic device being placed in a liquid cooling apparatus according to some embodiments of the present application. With reference to FIG. 2 first, the liquid cooled electronic device of some embodiments of the present application is placed in the liquid cooling apparatus 200 for heat dissipation via liquid cooling. The liquid cooling apparatus 200 is provided with a cooling liquid inlet 201 and a cooling liquid outlet 202. The cooling liquid inlet 201 and the cooling liquid outlet 202 are further in communication with a circulating pump and a cooling source apparatus (which are not shown in the figure) to form a circulation loop. A direction of a circulation flow of the cooling liquid is shown by a direction of hollow arrows in FIG. 2. It may be learned from FIG. 2 that, during operation of the liquid cooled electronic device, the cooling liquid enters from a lower portion of the liquid cooled electronic device, flows through an upper portion of the liquid cooled electronic device, and then flows out from the cooling liquid outlet 202. As such, one or more heating elements within the liquid cooled electronic device exchange heat with the cooling liquid circulating around, that is, the cooling liquid absorbs the heat. The cooling liquid, which has absorbed the heat, then releases the heat at the cooling source apparatus. The cooling liquid, after releasing the heat, enters the liquid cooling apparatus via the cooling liquid inlet due to action of the external circulating pump. Such a cycle is repeated, ensuring a normal requirement for heat dissipation of the liquid cooled electronic device is satisfied.

Specifically referring to FIG. 1 and FIG. 3, in some embodiments of the present application, the first direction may be, for example, a vertical direction. The chassis unit is circumferentially closed relative to the first direction, and the first accommodating space 11 extending in the first direction is formed. The first accommodating space 11 is configured for accommodating and mounting of the liquid cooled computing unit and the liquid cooled power supply unit. The amount of liquid cooled computing unit and the amount of liquid cooled power supply unit should each be at least one (1). The liquid cooled computing unit is slidably inserted into the first accommodating space 11 via the first guide rail. Similarly, the liquid cooled power supply unit is slidably inserted into the first accommodating space 11 via the second guide rail. The first guide rail and the second guide rail are arranged in parallel in the first direction. In this case, further referring to FIG. 3, it may be understood that the liquid cooled computing unit and the liquid cooled power supply unit are in parallel with each other. That is, the liquid cooled computing unit and the liquid cooled power supply unit are both vertically inserted into the first accommodating space 11 from an end of the chassis unit (for example, an upper end of the chassis unit). As such, when a certain liquid cooled computing unit or a certain liquid cooled power supply unit needs to be maintained and repaired, that liquid cooled computing unit or that liquid cooling power supply unit can be directly taken out from the chassis unit by simply removing cables that are electrically connected. Therefore, it is not necessary to take out the entire liquid cooled electronic device. This is convenient for targeted repair and maintenance, reduces operation steps and workloads, and improves efficiency of repair and maintenance.

It is readily understood that, in some embodiments of the present application, in addition to the liquid cooled computing unit and the liquid cooling power supply unit as described above, other apparatuses (for example, a liquid cooled storage unit, and the like) may also be placed in the first accommodating space 11 of the chassis unit. The details are not redundantly described herein.

It is readily understood that, in some embodiments of the present application, the liquid cooled computing unit is electrically connected to the liquid cooling power supply unit. The liquid cooled power supply unit provides operating power for the liquid cooled computing unit.

It is readily understood that, in some embodiments of the present application, a structure of the chassis unit is characterized in, for example, that a cross section of the chassis unit perpendicular to the first direction is a square or a rectangle. The liquid cooled computing unit and the liquid cooled power supply unit are wrapped within the chassis unit, so that the liquid cooled electronic device has good integrity. Since the chassis unit may be integrally formed through a molding process, accuracy of the first guide rail and the second guide rail may be guaranteed, so that an assembling error is reduced, which is convenient for manufacturing and assembling.

In a possible implementation, a second accommodating space 12 is additionally formed within a second end of the chassis unit 10 in the first direction. An overflow through hole 15 is provided on a side wall of the chassis unit 10 at a position corresponding to the second accommodating space 12, so that the cooling liquid flows in through a first end of the chassis unit 10 and flows out through the overflow through hole 15.

In some embodiments of the present application, the cooling liquid flows in from the first end of the chassis unit and flows out from the second end of the chassis unit. In addition, the second accommodating space is formed within the second end of the chassis unit. The chassis unit has the overflow through hole provided on the side wall on which the second accommodating space is formed. In this case, specifically referring to FIG. 2 and FIG. 3, the first end of the chassis unit is the lower end in the figure, and the second end of the chassis unit is the upper end in the figure. The cooling liquid flows in the chassis unit from the lower end and then flows out through the overflow through hole at the upper end.

Therefore, in some embodiments of the present application, with the second accommodating space and the overflow through hole arranged as described above, the cooling liquid may directly flow out via the overflow through hole without completely immersing the liquid cooled electronic device. As compared to a manner of completely immersing the liquid cooled electronic device in the cooling liquid, it may achieve technical effects of lowering the height of the cooling liquid within the liquid cooling apparatus and reducing an used amount of the cooling liquid, thereby saving costs.

In some embodiments of the present application, the second accommodating space may also be configured to accommodate an electrical transitioning apparatus that is used to electrically connect the liquid cooled computing unit with the liquid cooled power supply unit.

In some embodiments of the present application, a height of the second accommodating space in the first direction (that is, the vertical direction), a position of the overflow through hole in the second accommodating space, and a number of the overflow through holes may be determined according to an actual need, which are not redundantly described herein.

Figure 5:
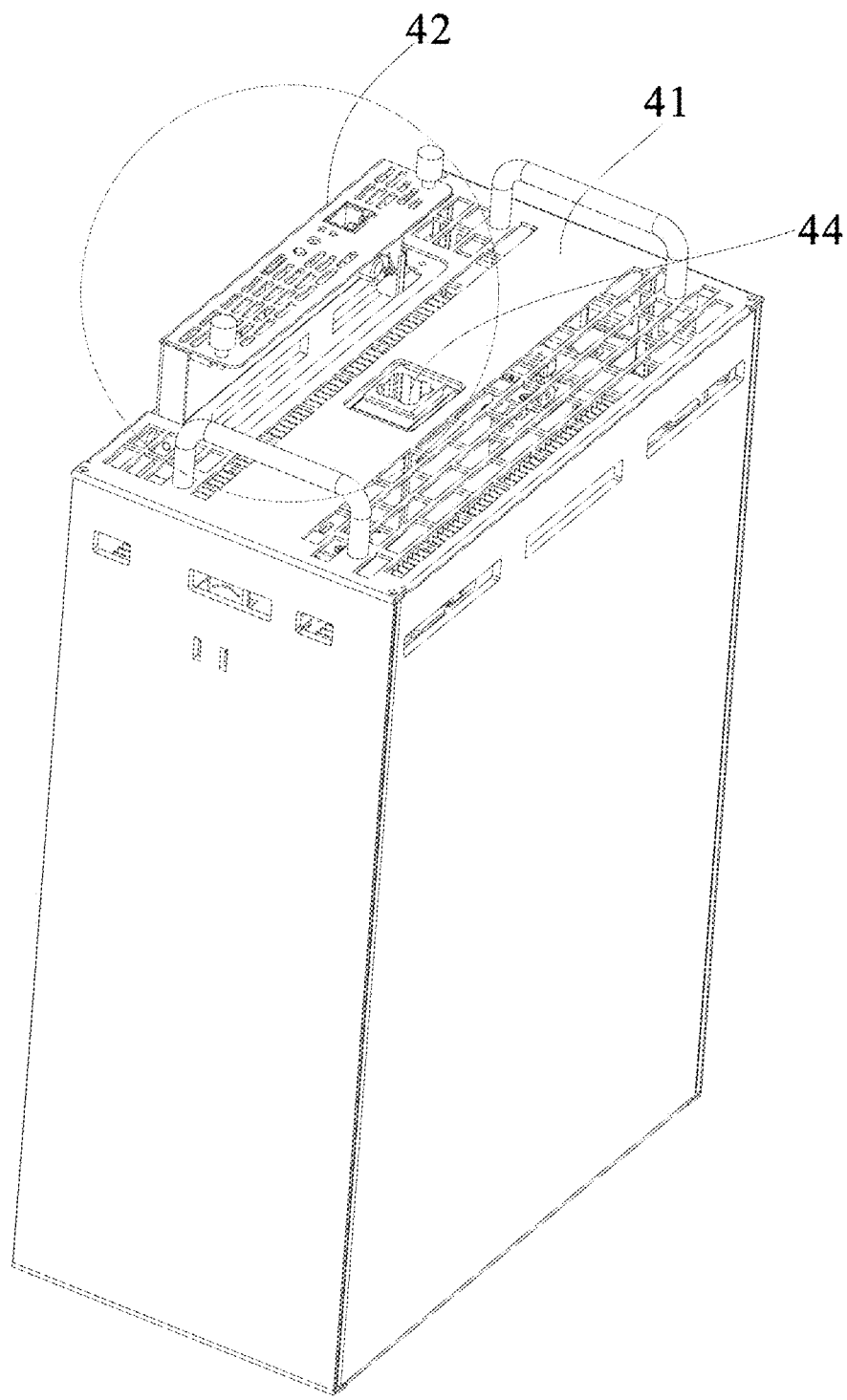
FIG. 5 is a schematic structural diagram of a control panel being inserted into a chassis panel according to some embodiments of the present application.

In a possible implementation, referring to FIG. 2 and FIG. 5, a panel unit 40 (as shown in FIG. 2) is mounted at the second end of the chassis unit 10. The panel unit 40 includes a chassis panel 41 and a control panel 42. The control panel 42 is inserted into the chassis panel 41 in the first direction, so that the control panel 42 is located in the second accommodating space 12. In addition, a height of the control panel 42 relative to the chassis panel 41 in the first direction is adjustable.

On a basis that the second accommodating space 12 is formed on the chassis unit 10, in some embodiments of the present application, the panel unit is mounted at the second end of the chassis unit. The panel unit includes the chassis panel and the control panel. With reference to FIG. 5, the chassis panel 41 is, for example, flat and is configured for covering the second end of the chassis unit. The control panel 42 is then inserted into the chassis panel 41 in the first direction. For example, the control panel 42 has a control element and the like mounted thereon. In this case, it can be understood that the control panel 42 is located in the second accommodating space, and an insertion length of the control panel 42 relative to the chassis panel 41 in the first direction is adjustable. That is, in some embodiments of the present application, a length with which the control panel 42 is inserted into the second accommodating space is adjustable, so that the control element and the like on the control panel 42 may be protected with such an arrangement described above.

For example, operation modes of the liquid cooled electronic device include a normal mode and an overclocking mode. The overclocking mode means that a computing speed of a computing component in the device is greater than a set value of the normal mode, thereby improving the performance. A computing power in the overclocking mode may be increased, resulting in a rise in a temperature of the cooling liquid that is circulating for heat dissipation in the liquid cooling system. For example, when the liquid cooled electronic device is in the normal mode, the height of the control panel 42 relative to the chassis panel 41 in the first direction may be adjusted such that the control panel 42 may be immersed in the cooling liquid. As such, the cooling liquid may have a technical effect of dissipating heat for the control element on the control panel 42 via liquid cooling. However, for example, when the liquid cooled electronic device is in the overclocking mode, the computing speed of the liquid cooled computing unit gets higher, the computing power is increased, and the temperature of the cooling liquid is increased. In this condition, the height of the control panel 42 relative to the chassis panel 41 in the first direction may be adjusted such that the control panel 42 is moved away from the cooling liquid. For example, the control panel 42 is pulled away by a certain length in the first direction so that the control panel 42 is above a liquid surface of the cooling liquid. The control panel 42 is cooled by surrounding air, and the control element and the like on the control panel 42 may be protected from damage caused by the cooling liquid that is at the higher temperature.

With the control panel arranged as a structure that is slidably inserted into the second accommodating space, a length of the chassis unit in the first direction may be minimized, the structure is compact, and use cost and transport cost are reduced, as compared with a fixed arrangement of the control panel.

It is readily understood that, in some embodiments of the present application, the height of the control panel relative to the chassis panel in the first direction is adjustable. Such an adjustable arrangement of the height may be an arrangement of the height that is continuously adjustable, or may be an arrangement of the height that is discretely adjustable.

Figure 6:
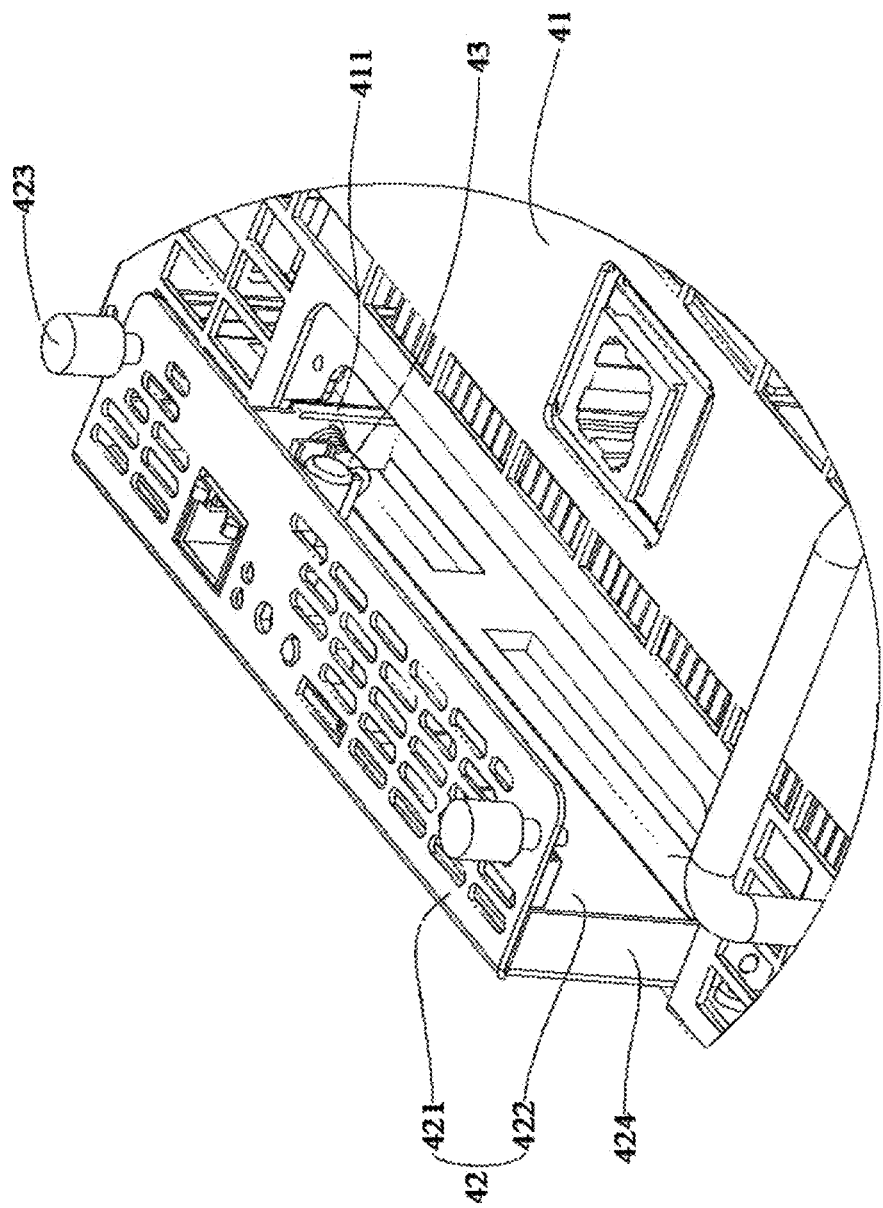
FIG. 6 is a partial enlarged view of FIG. 5.

It is readily understood that, in a possible implementation referring to FIG. 6, an insertion groove extending toward the second accommodating space 12 is provided on a side of the chassis panel 41. The control panel 42 includes a fixing plate 421 that is configured to be embedded in the chassis panel 41. An insertion guide rail 424 is arranged on a side of the fixing plate 421, and the insertion guide rail 424 is slidably inserted into the insertion groove.

Some embodiments of the present application relate to a possible structure for realizing slidable insertion of the chassis panel with the control panel. Specifically, an insertion groove is provided on a side of the chassis panel 41. The insertion groove faces towards the second accommodating space 12. The insertion groove is formed, for example, by a pair of guide plates 411 that are arranged in parallel in the first direction. The control panel includes, for example, a flat fixing plate 421. The fixing plate 421 is configured to be embedded in the chassis panel 41 and is fixed through a fixing hole and a fixing screw 423. A control board 422 is vertically connected to the fixing plate 421. A pair of insertion guide rails 424 are arranged on two sides of the control board 422. As such, the control panel may be slidably inserted into the chassis panel by the slidable insertion between the insertion guide rails 424 and the insertion groove described above.

Some embodiments of the present application disclose a possible structure for inserting the control panel into the chassis panel. Of course, the slidable insertion between the control panel and the chassis panel may also be implemented by other structural forms.

In a possible implementation, a limiting structure 43 is additionally arranged between the insertion groove and the insertion guide rail 424. The limiting structure 43 is configured for adjusting a length with which the insertion guide rail 424 is slidably inserted into the insertion groove in the first direction. The limiting structure 43 is movably mounted to the insertion guide rail 424. Alternatively, the limiting structure 43 is movably mounted to the insertion groove.

Some embodiments of the present application relate to a possible structure for making the height of the control panel adjustable relative to the chassis panel in the first direction. Specifically, a limiting structure is arranged between the insertion groove and the insertion guide rail. It can be understood that the limiting structure may be able to stop the insertion guide rail from further inserting into the insertion groove. In other words, the height of the control panel relative to the chassis panel in the first direction may be implemented as adjustable by arranging the limiting structure at different heights between the insertion groove and the insertion guide rail.

More specifically, referring to a partial enlarged view of FIG. 6, the limiting structure 43 may include, for example, a limiting member and a limiting insertion through hole that is configured for the limiting member to be inserted. One or more such limiting insertion through holes are provided on the insertion guide rail, so that the height may be adjustable by mounting the limiting member in limiting insertion through holes at different positions. Alternatively, the limiting insertion through holes may be provided on a side wall of the insertion groove.

In a possible implementation, one liquid cooled power supply unit 30 is electrically connected to at least two liquid cooled computing units 20. The at least two liquid cooled computing units 20 are located on the same side of the one liquid cooled power supply unit 30. Alternatively, the at least two liquid cooled computing units 20 are respectively arranged on two sides of the liquid cooled power supply unit 30.

That is, in some embodiments of the present application, one liquid cooled power supply unit is electrically connected to at least two liquid cooled computing units, and the liquid cooled computing units and the liquid cooled power supply unit may have a variety of quantitative correspondences or positional correspondences.

For example, a ratio of a number of the liquid cooling power supply units to a number of the liquid cooled computing units in the liquid cooled electronic device may be 1:2, 1:3, 1:4, and the like. That is, one liquid cooled power supply unit is electrically connected to two, three, or four liquid cooled computing units respectively. Referring to FIG. 3 and FIG. 4, FIG. 4 illustrates a position relationship between one liquid cooled power supply unit and two liquid cooled computing units. The two liquid cooled computing units may be both located on a same side of the liquid cooling power supply unit. Alternatively, referring to FIG. 3, the two liquid cooled computing units may be respectively arranged on two sides of the liquid cooling power supply unit.

For the cases that the ratio of the number of the liquid cooling power supply units to the number of the liquid cooled computing units is 1:3 and 1:4, details are not redundantly described.

Figure 7:
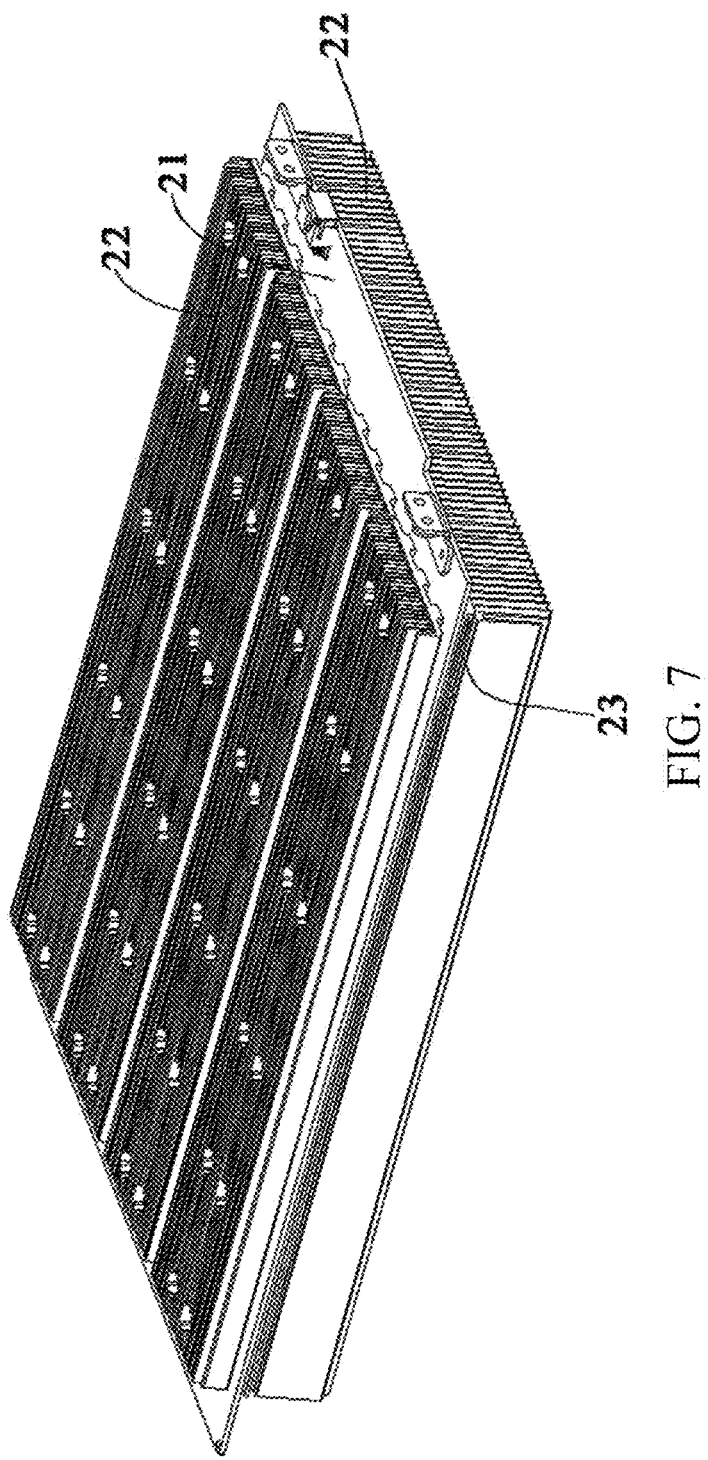
FIG. 7 is a schematic structural diagram of a liquid cooled computing unit according to some embodiments of the present application.

In a possible implementation, referring to FIG. 7 and FIG. 8, the liquid cooled computing unit 20 includes a computing board 21. A heat dissipation plate 22 is arranged on at least one side of the computing board 21. A pair of mounting guide grooves 23 are provided on two ends of the heat dissipation plate 22 in the first direction. A first guide rail includes a pair of mounting guide rails 13 arranged opposite to each other. The pair of mounting guide rails 13 are configured to be slidably inserted into the pair of mounting guide grooves 23.

Some embodiments of the present application specifically describe one possible structural form of the liquid cooled computing unit and the first guide rail.

Specifically, with reference to FIG. 7, the liquid cooled computing unit includes a computing board. Heating elements, such as chips, distributed in an array are tiled on one or two sides of the computing board. One or more heat dissipation plates are mounted to one or two sides of the computing board. One or more heat sinks are arranged vertically on the heat dissipation plate(s), so as to increase a contact area with the cooling liquid and thus increase a heat dissipation area. A pair of mounting guide grooves extending in the first direction are provided on two ends of each heat dissipation plate. The mounting guide grooves are, for example, C-shaped grooves. FIG. 7 shows a case that heat dissipation plates are arranged on both sides of the computing board and mounting guide grooves are provided on one of the heat dissipation plates. Of course, the computing board may have only one heat dissipation plate, provided with the mounting guide grooves, mounted thereto. Alternatively, the mounting guide grooves may be provided on two heat dissipation plates.

With reference to FIG. 8, corresponding to the C-shaped grooves as described above, the first guide rail includes a pair of mounting guide rails 13 arranged opposite to each other. The pair of mounting guide rails 13 are, for example, respectively arranged on inner surfaces of a pair of opposite side walls of the chassis unit 10. As such, the liquid cooled computing unit may be inserted into the chassis unit and accommodated in the first accommodating space by slidably inserting the pair of mounting guide grooves 23 along the pair of mounting guide rails 13. In embodiments of the present application, the liquid cooled computing unit and the liquid cooled power supply unit are both vertically inserted from a top portion of the chassis unit along the corresponding mounting guide rails. Also, a fast-mounting structure design is adopted. If any unit within the liquid cooled electronic device needs to be maintained, that unit may be taken out from the device only by simply removing the panel on the top of the liquid cooled electronic device and then removing components connected between the unit with other units, which facilitates on-site maintenance operations.

In a possible implementation, the second guide rail includes a pair of limiting guide grooves 14 arranged opposite to each other. The pair of limiting guide grooves 14 are configured for slidable insertion of two side walls of the liquid cooled power supply unit 30.

Some embodiments of the present application specifically describe one possible structural form of the liquid cooled power supply unit and the second guide rail.

Specifically, the liquid cooled power supply unit is, for example, in a shape of a cuboid or a cube. The second guide rail includes a pair of limiting guide grooves arranged opposite to each other. The pair of limiting guide grooves are, for example, respectively provided on inner surfaces of a pair of opposite side walls of the chassis unit. As such, the liquid cooled power supply unit may be inserted into the chassis unit and accommodated in the first accommodating space by slidably inserted the two opposite side walls of the liquid cooled power supply unit along the pair of limiting guide grooves.

In a possible implementation, a base plate unit 50 is mounted at the first end of the chassis unit 10. The base plate unit 50 has a flow hole 51 provided thereon for the cooling liquid to flow through.

Figure 9:
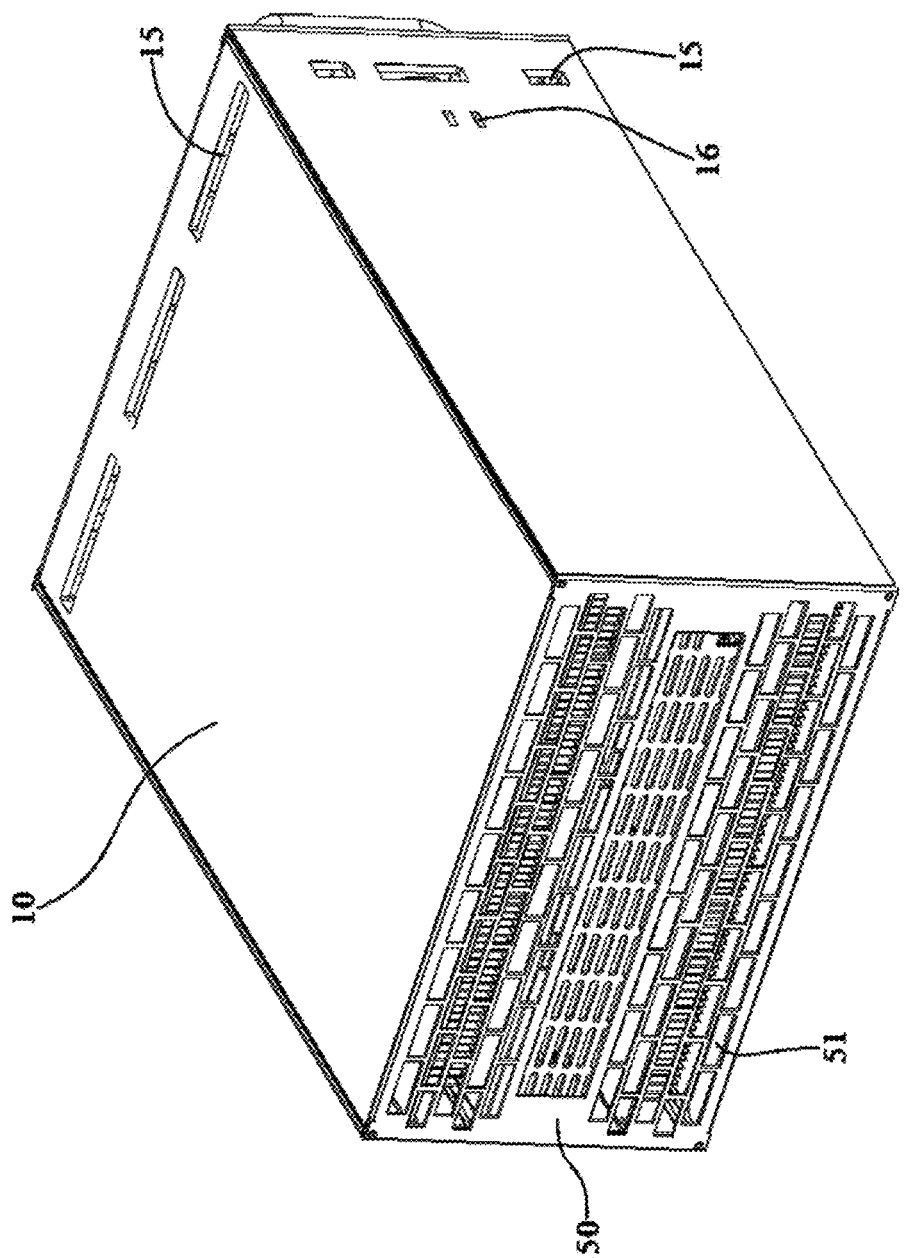
FIG. 9 is a schematic structural diagram of a base plate unit according to some embodiments of the present application.

With reference to FIG. 9, corresponding to the panel unit described above, the base plate unit is mounted at the first end of the chassis unit. The base plate unit is provided with one or more flow holes. The flow holes are configured for the cooling liquid to flow into the chassis unit from the lower end. The flow holes are distributed, for example, in an array. Also, sizes of the flow holes at different positions may be adjusted according to actual needs. In other words, diameters of the flow holes that correspond to the liquid cooled power supply unit and the liquid cooled computing unit respectively in the vertical direction may be different.

In addition, for the second end of the chassis unit, an overflow through hole is provided at the side wall close to the panel unit, so that the cooling liquid within the chassis unit may flow out from the overflow through hole without reaching the panel unit. However, in a condition that the flow of the cooling liquid suddenly increases, the overflow through hole may not be sufficient to guide the cooling liquid to exit the chassis unit in time. In this condition, a flow hole may be additionally provided on the panel unit to avoid imposing a large pressure on the chassis unit due to a sudden increase in the flow of the cooling liquid.

In a possible implementation, the liquid cooled computing unit 20 is electrically connected to the liquid cooled power supply unit 30 via a copper bar. Two ends of the liquid cooled power supply unit 30 respectively abut against the panel unit 40 and the base plate unit 50 in the first direction. The liquid cooled power supply unit 30 has an external input socket 32, and the panel unit 40 is provided with a power supply hole 44 corresponding to the external input socket 32. Additionally or alternatively, the two ends of the liquid cooled computing unit 20 respectively abut against a support boss 17 and a limiting block 45 in the first direction. The limiting block 45 is fixed to a side of the panel unit 40, and the support boss 17 is fixed to the first guide rail.

First, in some embodiments of the present application, for the electrical connection between the liquid cooled computing unit and the liquid cooling power supply unit, a copper bar 34 may be arranged in the second accommodating space, referring to FIG. 1. One end of the copper bar 34 is connected to the computing board of the liquid cooled computing unit, and the other end of the copper bar 34 is connected to a power supply terminal 31 of the liquid cooling power supply unit. In addition, the liquid cooled power supply unit further includes an external input socket 32, and the panel unit 40 is provided with a power supply hole 44 corresponding to the external input socket. As such, an external power supply cable is inserted in the external input socket to supply power to the liquid cooled electronic device.

Second, in some embodiments of the present application, for limiting and fixing of the liquid cooled power supply unit in the vertical direction, a normal practice may include arranging a lower end of the liquid cooled power supply unit to abut against the base plate unit. A limiting elastic piece 33 is then arranged on an upper end of the liquid cooling power supply unit, which mates with a limiting hole 16 on the chassis unit 10 and is fixed. Alternatively, the upper end of the liquid cooled power supply unit abuts against the panel unit through a support post.

Moreover, in some embodiments of the present application, for limiting and fixing of the liquid cooled computing unit in the vertical direction, a normal practice may include arranging a support boss and a limiting block at each of two ends of the liquid cooled computing unit. For example, referring to FIG. 8, a support boss 17 is arranged at a position close to a bottom portion of the mounting guide rail. The support boss is configured for supporting a bottom end of the liquid cooled computing unit. Then referring to FIG. 1, a limiting block 45 is arranged within the panel unit 40. The limiting block is configured for abutting against a top end of the liquid cooled computing unit. Supporting and limiting are therefore achieved.

The structures described above may realize fast mounting and disassembling of the liquid cooled power supply unit and the liquid cooled computing unit, which is convenient to operate. For example, when a certain liquid cooled computing unit needs to be removed, that liquid cooled computing unit can be taken out merely by first removing the panel unit and then unplugging cable(s) connected to the computing board, without taking out the whole liquid cooled electronic device. This is convenient for the maintenance operation.

Basic principles of the present application have been described above with reference to specific embodiments. However, it should be noted that the advantages, effects, and the like mentioned in the present application are merely examples but not limitations. These advantages, effects, and the like should not be considered to be necessary for the embodiments of the present application. In addition, the specific details disclosed above are only for illustrative purposes and for convenience of understanding, rather than limitation. The above details do not limit the present application to implementation of the above specific details.

The block diagrams of the device, apparatus, equipment, and system involved in the present application are merely illustrative examples and are not intended to require or imply that the device, apparatus, equipment, and system must be connected, arranged, and configured in the manner as shown in the block diagrams. Those skilled in the art understand that the device, apparatus, equipment, and system may be connected, arranged, and configured in any manner. Terms such as "include", "comprise", "have", and the like are open terms that mean "including but not limited to" and may be used interchangeably. The term "or" used herein refer to the terms "and/or" and may be used interchangeably, unless the context clearly dictates otherwise. The expression "such as" used herein refers to the phrase "such as but not limited to" and may be used interchangeably.

It should further be noted that the components or steps in the apparatus, device, and method of the present application may be decomposed and/or recombined. The decomposition and/or recombination shall be regarded as equivalent solutions of the present application.

The above description of the disclosed aspects is provided to enable a person skilled in the art to implement or use the present application. Various modifications to these aspects are obvious to those skilled in the art. General principles defined herein may be applied to other aspects without departing from the scope of the present application. Therefore, the present application is not intended to be limited to the aspects shown herein, but has a widest scope consistent with the principles and novel features disclosed herein.

The above description has been given for the purposes of illustration and description. In addition, this description is not intended to limit the embodiments of the present application to the form disclosed herein. Although a variety of exemplary aspects and embodiments have been discussed above, those skilled in the art understand that certain variations, modifications, changes, additions, and sub-combinations thereof shall fall within the protection scope of the present application.

What is claimed is:

1. A liquid cooled electronic device, comprising:
   a chassis unit that is circumferentially closed relative to a first direction, with a first accommodating space extending in the first direction formed within the chassis unit,
   a liquid cooled computing unit that is arranged in the first accommodating space;
   a liquid cooled power supply unit that is arranged in the first accommodating space and is electrically connected to the liquid cooled computing unit;
   a first guide rail and a second guide rail that are respectively arranged within the chassis unit at positions corresponding to the first accommodating space, wherein the first guide rail is configured for insertion of the liquid cooled computing unit, and the second guide rail is configured for insertion of the liquid cooled power supply unit, the first guide rail and the second guide rail extend in parallel in the first direction, so that the liquid cooled computing unit and the liquid cooled power supply unit are arranged parallelly;
   a second accommodating space that is additionally formed within a second end of the chassis unit in the first direction; and
   a panel unit that is mounted at the second end of the chassis unit, the panel unit comprises a chassis panel and a control panel, and the control panel is inserted into the chassis panel in the first direction, so that the control panel is located in the second accommodating space; and a height of the control panel relative to the chassis panel in the first direction is adjustable.

2. The liquid cooled electronic device according to claim 1, further comprising an overflow through hole provided on a side wall of the chassis unit at a position corresponding to the second accommodating space, so that a cooling liquid flows in from a first end of the chassis unit and flows out from the overflow through hole.

3. The liquid cooled electronic device according to claim 1, wherein an insertion groove extending toward the second accommodating space is provided on a side of the chassis panel; the control panel comprises a fixing plate configured to be embedded in the chassis panel, an insertion guide rail is arranged on a side of the fixing plate, and the insertion guide rail is slidably inserted into the insertion groove.

4. The liquid cooled electronic device according to claim 3, wherein a limiting structure is additionally arranged between the insertion groove and the insertion guide rail, and the limiting structure is configured for adjusting a length with which the insertion guide rail is slidably inserted into the insertion groove in the first direction; and wherein the limiting structure is movably mounted to the insertion guide rail, or the limiting structure is movably mounted to the insertion groove.

5. The liquid cooled electronic device according to claim 1, wherein a base plate unit is mounted to the first end of the chassis unit, and a flow hole is provided on the base plate unit for the cooling liquid to flow through.

6. The liquid cooled electronic device according to claim 5, wherein the liquid cooled computing unit is electrically connected to the liquid cooled power supply unit via a copper bar;
   two ends of the liquid cooled power supply unit respectively abut against the panel unit and the base plate unit in the first direction, the liquid cooled power supply unit has an external input socket, and the panel unit is provided with a power supply hole corresponding to the external input socket; and/or
   two ends of the liquid cooled computing unit respectively abut against a support boss and a limiting block in the first direction, the limiting block is fixed to a side of the panel unit, and the support boss is fixed to the first guide rail.

7. The liquid cooled electronic device according to claim 1, wherein an amount of the liquid cooled power supply unit is at least one, and an amount of the liquid cooled computing unit is at least two; and the at least one liquid cooled power supply unit is connected to the at least two liquid cooled computing units, wherein, the at least two liquid cooled computing units are located on a same side of the at least one liquid cooled power supply unit; or the at least two liquid cooled computing units are respectively arranged on two sides of the at least one liquid cooled power supply unit.

8. The liquid cooled electronic device according to claim 1, wherein the liquid cooled computing unit comprises a computing board, a heat dissipation plate is arranged on at least one side of the computing board, and a pair of mounting guide grooves are provided on two ends of the heat dissipation plate in the first direction; and wherein the first guide rail comprises a pair of mounting guide rails arranged opposite to each other, and the pair of mounting guide rails are configured to be slidably inserted into the pair of mounting guide grooves.

9. The liquid cooled electronic device according to claim 1, wherein the second guide rail comprises a pair of limiting guide grooves arranged opposite to each other, and the pair of limiting guide grooves are configured for slidable insertion of two side walls of the liquid cooled power supply unit.

* * * * *